(12) United States Patent
Lin et al.

(10) Patent No.: US 12,002,857 B2
(45) Date of Patent: Jun. 4, 2024

(54) HIGH ELECTRON MOBILITY TRANSISTOR (71) Applicant: Vanguard International Semiconductor Corporation, Hsinchu (TW)

(72) Inventors: Shin-Cheng Lin, Hsinchu County (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 429 days.

(21) Appl. No.: 17/539,078

(22) Filed: Nov. 30, 2021

(65) Prior Publication Data

US 2023/0170389 A1    Jun. 1, 2023

(51) Int. Cl.
*H01L 29/15*    (2006.01)
*H01L 29/10*    (2006.01)
(Continued)

(52) U.S. Cl.
CPC ...... *H01L 29/1075* (2013.01); *H01L 29/2003* (2013.01); *H01L 29/205* (2013.01); *H01L 29/7786* (2013.01)

(58) Field of Classification Search
CPC ............ H01L 29/1075; H01L 29/2003; H01L 29/205; H01L 29/7786; H01L 29/66462; H01L 27/0688; H01L 29/7787; H01L 27/092; H01L 29/778; H01L 29/4175; H01L 29/402; H01L 27/088; H01L 29/7783; H01L 29/41758; H01L 21/8252; H01L 2924/13091; H01L 29/66431; H01L 29/7781; H01L 29/452; H01L 21/0254;
(Continued)

(56) References Cited

U.S. PATENT DOCUMENTS

| 2006/0255403 | A1 | 11/2006 | Asano |
| 2017/0294528 | A1* | 10/2017 | Ren ..................... H01L 29/4175 |

(Continued)

FOREIGN PATENT DOCUMENTS

| CN | 101989601 A | * | 3/2011 | ......... H01L 21/8252 |
| CN | 108767008 A | | 11/2018 | |

(Continued)

*Primary Examiner* — Niki H Nguyen
(74) *Attorney, Agent, or Firm* — Winston Hsu (57) ABSTRACT

A high electron mobility transistor includes a substrate, a compound semiconductor stacked layer, a cap layer, a gate electrode, a source electrode, a drain electrode, and a buried electrode and/or a conductive structure. The substrate has an active area. The cap layer is disposed on the compound semiconductor stacked layer. The gate electrode is disposed on the cap layer and extends along a first direction. The source electrode and the drain electrode are disposed on the compound semiconductor stacked layer, respectively on two sides of the gate electrode, and arranged along a second direction, where the first direction is perpendicular to the second direction. The conductive structure and/or the buried electrode passes through the compound semiconductor stacked layer and surrounds or lies in the active area, where the conductive structure and/or the buried electrode has a constant electric potential or is grounded.

19 Claims, 5 Drawing Sheets

(51) Int. Cl.
  *H01L 29/20* (2006.01)
  *H01L 29/205* (2006.01)
  *H01L 29/778* (2006.01)
  *H01L 31/0256* (2006.01)

(58) Field of Classification Search
  CPC . H01L 29/432; H01L 29/0891; H01L 29/737;
  H01L 2924/1305; H01L 27/098; H01L
  2224/49111; H01L 2924/13055; H01L
  27/1211; H01L 29/0821; H01L 29/1004;
  H01L 31/0725; H01L 2924/10272; H01L
  2924/1306; H01L 29/66242; H01L
  29/7371; H01L 2924/13051; H01L
  2924/13064; H01L 29/404; H01L 29/772;
  H01L 2924/13062; H01L 21/82285;
  H01L 21/7806; H01L 21/76877; H01L
  2224/08145; H01L 2224/32145; H01L
  27/095; H01L 29/0696; H01L 29/42356;
  H01L 29/42392; H01L 29/66848; H01L
  29/7393; H01L 29/732; H01L 29/739;
  H01L 29/7392
  See application file for complete search history.

(56) References Cited

U.S. PATENT DOCUMENTS

2019/0097001 A1\* 3/2019 LaRoche ................. H01L 29/45
2020/0243668 A1    7/2020 Era

FOREIGN PATENT DOCUMENTS

| TW | 201824536 A | 7/2018 |
| TW | I692868 B | 5/2020 |
| TW | 202046504 A | 12/2020 |
| TW | 202114226 | 4/2021 |

\* cited by examiner

HIGH ELECTRON MOBILITY TRANSISTOR

BACKGROUND OF THE INVENTION

1. Field of the Invention

The present disclosure relates generally to the field of semiconductor devices, and more particularly to high electron mobility transistors.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different energy gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties, such as high electron mobility and the ability to transmit signals at high frequencies.

Although HEMTs have many advantages, conventional HEMTs still have many problems that need to be overcome in high-current and high-voltage applications.

SUMMARY OF THE INVENTION

In view of this, it is necessary to provide an improved HEMT without the drawbacks of conventional HEMTs.

According to one embodiment of the present disclosure, a high electron mobility transistor (HEMT) is disclosed and includes a substrate, a compound semiconductor stacked layer, a cap layer, a gate electrode, a source electrode, a drain electrode, and a buried electrode. The substrate has an active area. The compound semiconductor stacked layer includes a buffer layer, a high resistance layer, a channel layer, and a barrier layer, which are disposed on the substrate in sequence. The gate electrode is disposed on the cap layer and extends along a first direction. The source electrode and drain electrode are disposed on the compound semiconductor stacked layer, respectively disposed on two sides of the gate electrode, and arranged along a second direction, where the first direction is perpendicular to the second direction. The buried electrode passes through the compound semiconductor stacked layer, is disposed in the active area, and is configured to have a constant electric potential or be grounded. The source electrode includes a first portion and a second portion arranged along the first direction, the buried electrode is disposed between the first portion and the second portion, and the buried electrode is separated from the first portion and the second portion.

According to one embodiment of the present disclosure, a high electron mobility transistor (HEMT) is disclosed and includes a substrate, a compound semiconductor stacked layer, and a conductive structure. The substrate has an active area, and the active area includes a plurality of repeating units. The compound semiconductor stacked layer includes a buffer layer, a high resistance layer, a channel layer, and a barrier layer, which are disposed on the substrate in sequence. The conductive structure passes through the compound semiconductor stacked layer, surrounds the active area, and is configured to have a constant electric potential or be grounded. At least one repeating unit includes a cap layer disposed on the compound semiconductor stacked layer, a gate electrode disposed on the cap layer and extending along a first direction, and a source electrode and a drain electrode disposed on the compound semiconductor stacked layer, respectively disposed on two sides of the gate electrode, and arranged along a second direction, where the first direction is perpendicular to the second direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

The present disclosure is directed to a high electron mobility transistor (HEMT), which may be used as power switching transistors for voltage converter applications. Compared to silicon power transistors, III-V HEMTs feature low on-state resistances and low switching losses due to wide bandgap properties.

Figure 1:
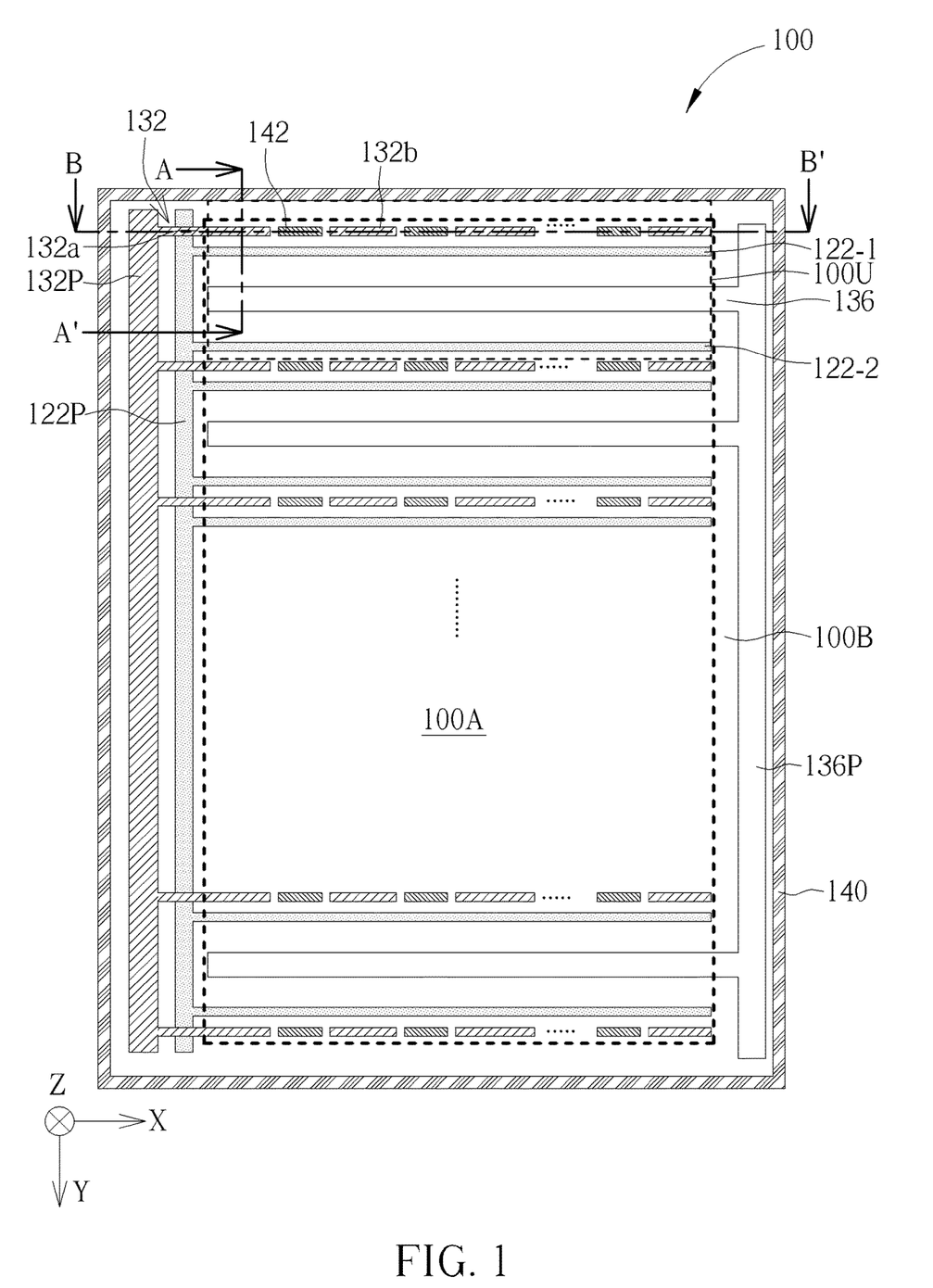
FIG. 1 is a schematic top view of a high electron mobility transistor (HEMT) according to one embodiment of the present disclosure.

FIG. 1 is a schematic top view of a HEMT according to one embodiment of the present disclosure. As shown in FIG. 1, according to one embodiment of the present disclosure, a HEMT 100, such as an enhancement-mode HEMT, may include an active area 100A and a peripheral area 100B surrounding the active area 100A. A conductive structure 140 is not disposed in the active area 100A, and is separated from a source electrode 132, gate electrodes 122-1 and 122-2, and a drain electrode 136 in the active area 100A. The conductive structure 140 is electrically connected to the source electrode 132 through an interconnection structure. In one embodiment, the conductive structure 140 may be a continuous ring as shown in FIG. 1. In other embodiments, the conductive structure 140 may be a discontinuous ring surrounding the active area. In addition, the conductive structure 140 may be disposed together with a seal ring structure (not shown in FIG. 1) in the peripheral area 100B surrounding the active area 100A.

According to one embodiment of the present disclosure, the active area 100A includes a plurality of repeating units 100U, and each repeating unit 100U may include the source electrode 132, the gate electrode 122-1, the drain electrode 136, and the gate electrode 122-2 arranged along one direction (for example, the y direction in FIG. 1) in sequence. The source electrode 132 includes a plurality of source portions, such as source portions 132a and 132b. These source portions 132a and 132b are arranged along another direction (for example, the x direction in FIG. 1) and are separated from each other. The multiple source portions 132a and 132b extending along the x direction may construct one of fingers of a source finger electrode, and the source electrode 132 is disposed on one side of the gate electrode 122-1. Each drain electrode 136 may construct one of the fingers of a drain finger electrode, and is disposed on another side of the gate electrode 122-1. In addition, in one embodiment, the drain electrode 136 is also disposed between the two gate electrodes 122-1 and 122-2. This embodiment may be referred to as a common drain layout. Moreover, in the layout of FIG. 1, the source electrodes 132 are disposed in regions outside the two gate electrodes 122-1 and 122-2, and the source electrodes 132 are also disposed on the upper and lower sides of the active area 100A. In addition, as shown in FIG. 1, in one embodiment, the source finger electrode constructed of the source electrodes 132 is connected to a contact pad 132P of the source electrodes, and a gate finger electrode constructed of gate electrodes 122-1 and 122-2 is connected to a contact pad 122P of the gate electrodes. The contact pad 132P of the source electrodes and the contact pad 122P of the gate electrodes may be disposed on the same side of the active area 100A (for example, the left side), and the contact pad 132P of the source electrodes may be disposed in a region outside the contact pad 122P of the gate electrodes. The drain finger electrode constructed of the drain electrodes 136 is connected to a contact pad 136P of the drain electrodes. The contact pad 136P of the drain electrodes is disposed on another side (for example, the right side) of the active area 100A. The above mentioned number and layout of the contact pad 132P of the source electrodes, the contact pad 122P of the gate electrodes, and the contact pad 136P of the drain electrodes are only for an example, and the embodiments of the present disclosure are not limited thereto.

According to an embodiment of the present disclosure, at least one repeating unit 100U of the active area 100A includes a buried electrode 142, and the buried electrode 142 is disposed between the adjacent source portions 132a and 132b of the source electrode 132. The buried electrode 142 may be referred to as a through via. The buried electrode 142 is separated from the source portions 132a and 132b of the source electrode 132. One repeating unit 100U may include one or more buried electrodes 142. In addition, in one embodiment, each repeating unit 100U of the active are 100A may include one or more buried electrodes 142. In another embodiment, some repeating units 100U of the active area 100A may include one or more buried electrodes 142, and the other repeating units 100U may not include the buried electrode 142. For example, the buried electrodes 142 may be omitted in one or more repeating units 100U. Therefore, for two adjacent repeating units 100U, the buried electrode 142 may be disposed only in one of the repeating units 100U, but not limited thereto. The number and arrangement of the buried electrodes 142 in the active area 100A may be determined according to the electrical requirements of the HEMT.

Figure 2A:
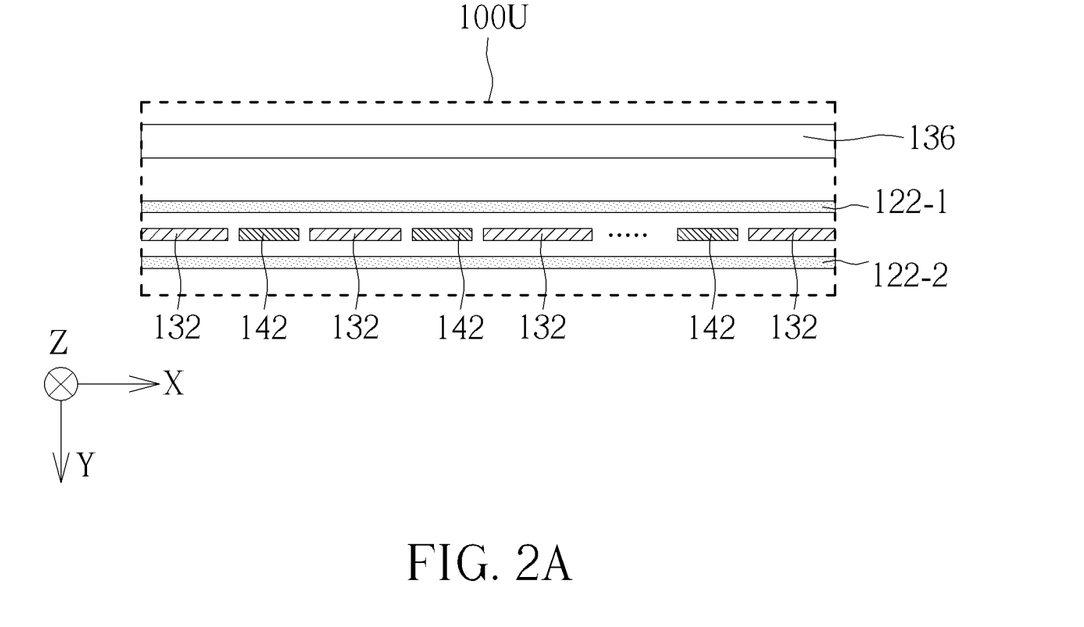
FIG. 2A is a schematic top view of a repeating unit of a HEMT according to another embodiment of the present disclosure.

FIG. 2A is a schematic top view of a repeating unit of a HEMT according to another embodiment of the present disclosure. The difference between FIG. 2A and FIG. 1 is that the layout of the repeating unit 100U in FIG. 2A is a common source layout, where the source electrode 132 is disposed between the two gate electrodes 122-1 and 122-2. Moreover, in the layout of the repeating unit 100U in FIG. 2A, the drain electrodes 136 are disposed in regions outside the two gate electrodes 122-1 and 122-2, and the drain electrodes 136 are also disposed on the upper and lower sides of the active area 100A.

Figure 2B:
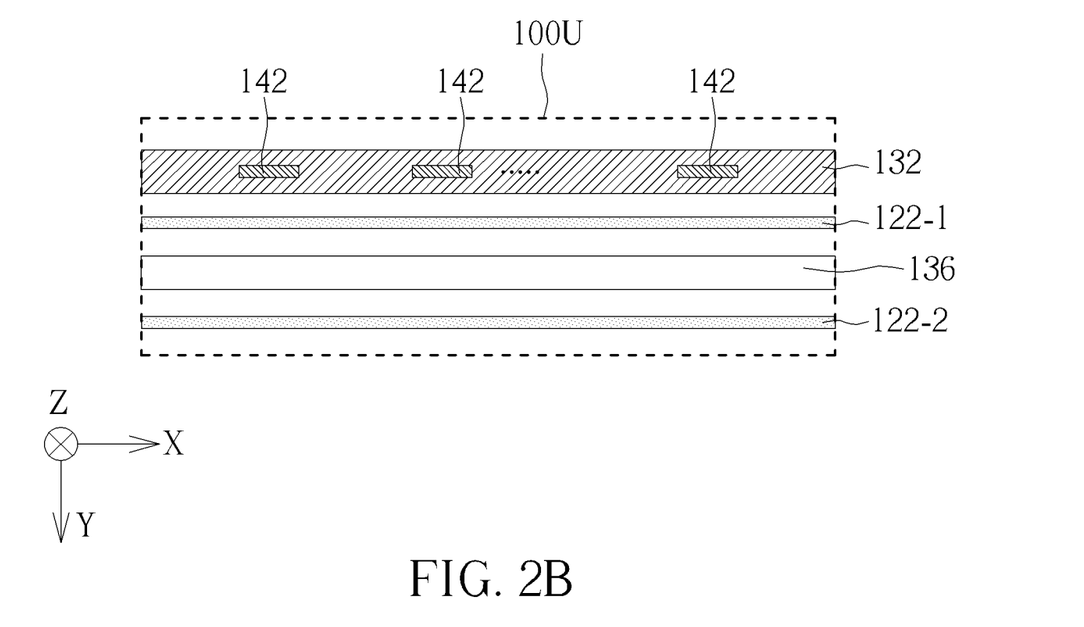
FIG. 2B is a schematic top view of a repeating unit of a HEMT according to another embodiment of the present disclosure.

FIG. 2B is a schematic top view of a repeating unit of a HEMT according to another embodiment of the present disclosure. The difference between FIG. 2B and FIG. 1 is that the source electrode 132 in the repeating unit 100U of FIG. 2B is not disconnected, that is, the source electrode 132 has a continuous electrode pattern along the x direction. In the top view, one or more buried electrodes 142 are disposed in the projection area of the source electrode 132, for example, the multiple buried electrodes 142 may be arranged along the x direction and separated from each other in the projection area of the source electrode 132. In one embodiment, the top surface of the buried electrode 142 and the top surface of the source electrode 132 may be on the same plane. In other embodiments, the top surface of the buried electrode 142 may be lower than the top surface of the source electrode 132, and the top surface of the buried electrode 142 may be at least in contact with the bottom surface of the source electrode 132, so that the buried electrode 142 is electrically connected to the source electrode 132.

Figure 3:
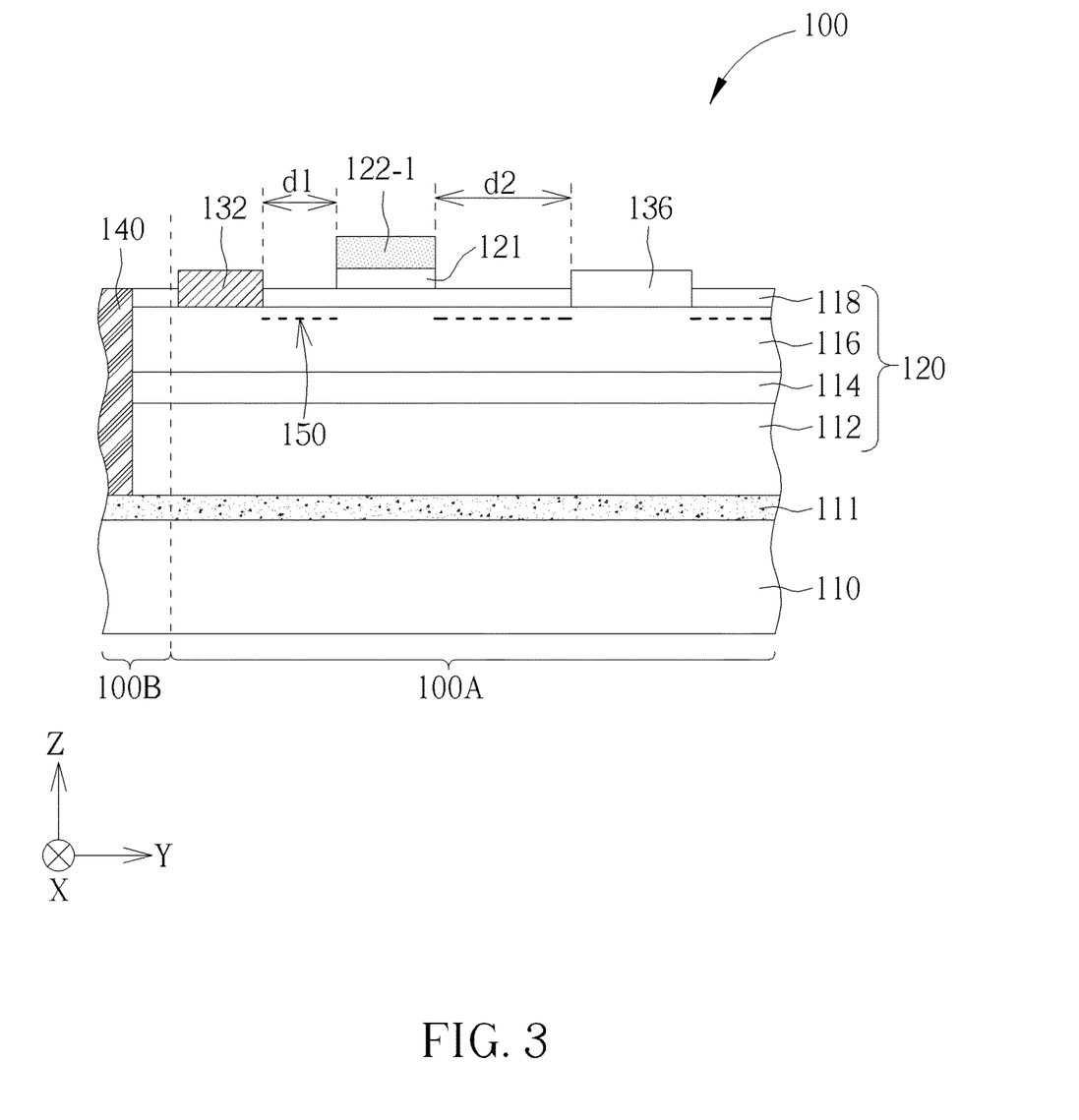
FIG. 3 is a schematic cross-sectional view of a HEMT according to one embodiment of the present disclosure, which is taken along the line A-A' of FIG. 1.

FIG. 3 is a schematic cross-sectional view of a HEMT according to one embodiment of the present disclosure, which is taken along the line A-A' of FIG. 1. As shown in FIG. 3, according to one embodiment of the present disclosure, the HEMT 100 includes a substrate 110, and a semiconductor layer 111 is disposed on the substrate 110. The semiconductor layer 111 may be used as a seed layer, such as a silicon-containing seed layer. Through disposing the semiconductor layer 111 on the substrate 110, a compound semiconductor stacked layer 120 may be grown on the seed layer. In addition, the semiconductor layer 111 has appropriate conductivity, and is not electrically insulating. According to some embodiments of the present disclosure, the material of the semiconductor layer 111 includes silicon, gallium nitride, ceramic, silicon carbide, aluminum nitride, aluminum oxide, or a combination thereof. The compound semiconductor stacked layer 120 is disposed on the semiconductor layer 111. The compound semiconductor stacked layer 120 includes a buffer layer 112, a high resistance layer 114, a channel layer 116, and a barrier layer 118, which are disposed on the semiconductor layer 111 and the substrate 110 from bottom to top in sequence. Each layer of the compound semiconductor stacked layer 120 may be formed by epitaxially growing group III-V semiconductor. According to one embodiment of the present disclosure, the buffer layer 112 may include a super lattice structure, such as including a plurality of pairs of group III-V binary semiconductor and group III-V ternary semiconductor, for example aluminum nitride (AlN), aluminum gallium nitride (AlGaN) or a combination thereof. The composition of the high-resistance layer 114 may be, for example, carbon-doped gallium nitride (C: GaN), and the resistivity of the high-resistance layer 114 is higher than the resistivity of the buffer layer 112.

The channel layer 116 may include one or more group III-V semiconductor layers, and the composition of the group III-V semiconductor layers may be GaN, AlGaN, InGaN, or InAlGaN, but not limited thereto. In addition, the channel layer 116 may be undoped or doped one or more group III-V semiconductor layers. The doped channel layer 116 may be, for example, a p-type group III-V semiconductor layer. For the p-type group III-V semiconductor layer, the dopant may be carbon (C), iron (Fe), magnesium (Mg) or zinc (Zn), but not limited thereto. The barrier layer 118 may include one or more group III-V semiconductor layers, and its composition is different from the group III-V semiconductor of the channel layer 116. For example, the barrier layer 118 may include AlN, AlGaN, or a combination thereof. According to an embodiment, the channel layer 116 may be an undoped GaN layer, and the barrier layer 118 may be an intrinsic n-type AlGaN layer.

In addition, a patterned cap layer 121 is further disposed on the barrier layer 118 to deplete the 2-DEG region to achieve the normally-off state of the HEMT. In one embodiment, the cap layer 121 may be, for example, a p-type cap layer or an n-type cap layer. The cap layer 121 may be one or more doped group III-V semiconductor layers, its composition may be GaN, AlGaN, InGaN or InAlGaN, and its dopant may be C, Fe, Mg or Zn, but not limited thereto. According to one embodiment, the cap layer 121 may be a p-type GaN layer. The gate electrode 122-1 is disposed on the cap layer 121 and extends along a first direction (for example, the x direction). The source electrode 132 and the drain electrode 136 are disposed on the compound semiconductor stacked layer 120, respectively disposed on two opposite sides of the gate electrode 122-1, and are arranged along a second direction (for example, the y direction), where the first direction is perpendicular to the second direction. The source electrode 132 and the drain electrode 136 may pass through the barrier layer 118 to the top surface of the channel layer 116, or to a position within the channel layer 116. In addition, according to an embodiment of the present disclosure, as shown in FIG. 3, a distance d2 between the drain electrode 136 and the gate electrode 122-1 may be greater than a distance d1 between the source electrode 132 and the gate electrode 122-1 due to the drain electrode 136 is usually applied with a high voltage. Therefore, the distance d2 between the drain electrode 136 and the gate electrode 122-1 is greater than the distance d1 between the source electrode 132 and the gate electrode 122-1.

Since there is a bandgap discontinuity between the channel layer 116 and the barrier layer 118, by stacking the channel layer 116 and the barrier layer 118 on each other, a thin layer of electrons will be accumulated in the heterojunction between the channel layer 116 and the barrier layer 118 due to the piezoelectric effect. Therefore, a thin layer with high electron mobility is generated, that is, a two-dimensional electron gas (2-DEG) region 150. For normally off devices, when no voltage is applied to the gate electrode 122-1, the region covered by the cap layer 121 will not form 2-DEG (as shown in FIG. 3), which may be regarded as a 2-DEG cutoff region, and there is no conduction between the source electrode 132 and the drain electrode 136. When a positive voltage is applied to the gate electrode 122-1, the region covered by the cap layer 121 will form 2-DEG, so that a continuous 2-DEG region 150 is formed between the source electrode 132 and the drain electrode 136, and there is conduction between the source electrode 132 and the drain electrode 136.

According to an embodiment, the source electrode 132 and the drain electrode 136 may have a single-layered or multi-layered structure, and its composition may include an ohmic contact metal. The ohmic contact metal refers to a metal, an alloy or a stacked layer thereof that produces ohmic contact with a semiconductor layer (such as the channel layer 116). The ohmic contact metal is such as Ti, Ti/Al, Ti/Al/Ti/TiN, Ti/Al/Ti/Au, Ti/Al/Ni/Au or Ti/Al/Mo/Au, but not limited thereto. The gate electrodes 122-1 and 122-2 may have a single-layered or multi-layered structure, for example, a double-layered structure including a first conductive layer and a second conductive layer. The first conductive layer may directly contact the cap layer 121, and its composition includes a Schottky contact metal. The Schottky contact metal refers to a metal, an alloy or a stacked layer thereof that produces Schottky contact with a semiconductor layer (such as the cap layer 121). The Schottky contact metal is such as TiN, W, Pt, or Ni, but not limited thereto. The composition of the second conductive layer may include Ti, Al, Au, Mo, but not limited thereto. According to an embodiment, the first conductive layer may further include a metal nitride of a refractory metal, and the refractory metal may be selected from a group consisting of titanium, zirconium, hafnium, vanadium, niobium, tantalum, chromium, molybdenum, tungsten, manganese, technetium, rhenium, ruthenium, osmium, rhodium and iridium.

According to an embodiment of the present disclosure, the conductive structure 140 passes through the compound semiconductor stacked layer 120 and directly contacts the semiconductor layer 111. For example, the conductive structure 140 may contact the top surface of the semiconductor layer 111, or reach a position within the semiconductor layer 111, or pass through the semiconductor layer 111. According to an embodiment of the present disclosure, the conductive structure 140 may be formed by etching the compound semiconductor stacked layer 120 to form a trench to expose the semiconductor layer 111, and filling the trench with a conductive material. Therefore, the conductive structure 140 may be electrically connected to the semiconductor layer 111. According to some embodiments of the present disclosure, a constant electric potential, such as 0V or 1V, may be provided to the conductive structure 140 according to the actual requirements, so that the semiconductor layer 111 electrically connected to the conductive structure 140 also has a constant electric potential. In a preferred embodiment, the conductive structure 140 and the semiconductor layer 111 are grounded, thereby avoiding the back-gating effect in the HEMT 100. The conductive material of the conductive structure 140 may be a metal, an alloy, or polysilicon. The metal or alloy is, for example, Au, Ni, Pt, Pd, Ir, Ti, Cr, W, Al, Cu, TiN, TaN or a combination thereof. In addition, the conductive structure 140 may further include an insulating lining layer (not shown) deposited on the inner wall of the above mentioned trench to isolate the conductive material of the conductive structure 140 from the compound semiconductor stacked layer 120, and to further increase the adhesion of the conductive material. The material of the insulating lining layer is, for example, silicon nitride, silicon oxide, silicon oxynitride, or a combination thereof. In order to electrically connect the conductive structure 140 to the semiconductor layer 111, the insulating lining layer is not disposed between the conductive material and the semiconductor layer 111.

Figure 4:
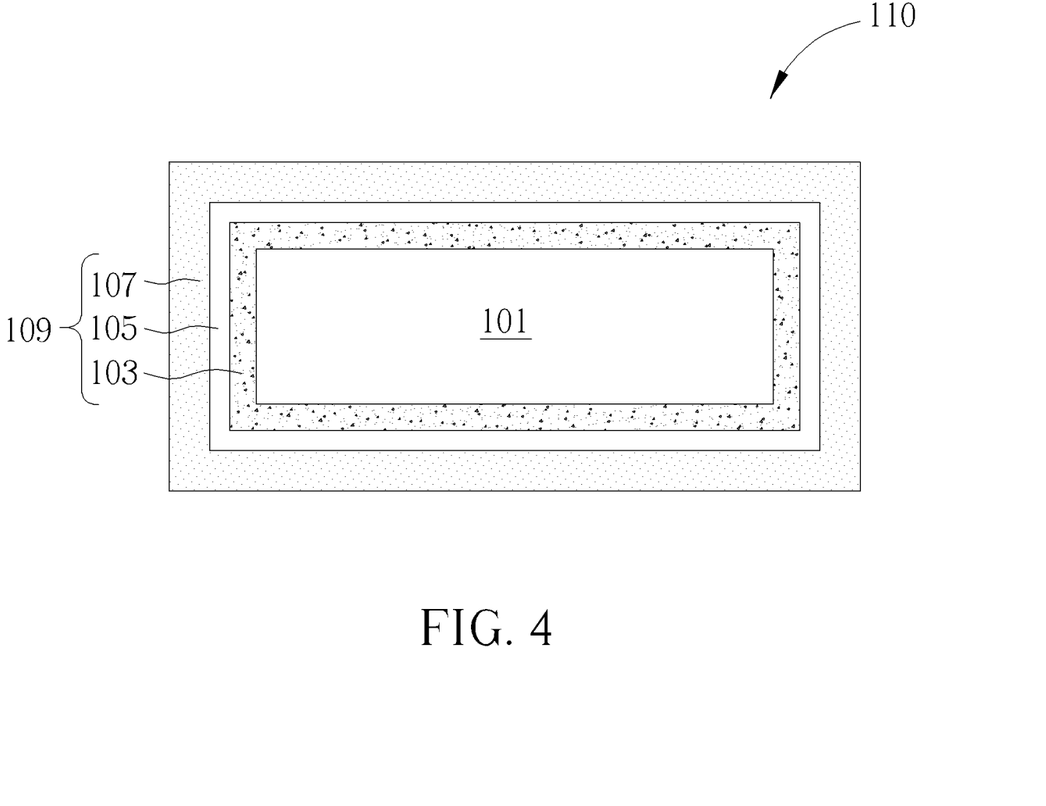
FIG. 4 is a schematic cross-sectional view of a substrate of a HEMT according to one embodiment of the present disclosure.

FIG. 4 is a schematic cross-sectional view of a substrate of a HEMT according to one embodiment of the present disclosure. As shown in FIG. 4, according to an embodiment of the present disclosure, the substrate 110 of the HEMT 100 may include a core substrate 101 and a composite material layer 109 wrapping around the top surface, the bottom surface, and the side surfaces of the core substrate 101. The material of the core substrate 101 may be a material that matches the thermal expansion coefficient of the compound semiconductor stacked layer 120 subsequently formed on the substrate 110. The material of the core substrate 101 is, for example, ceramic, silicon carbide, aluminum nitride, or sapphire. Moreover, the core substrate 101 may be selected from a material having a higher hardness to provide the substrate 110 with sufficient mechanical strength. According to an embodiment of the present disclosure, the composite material layer 109 may include a first insulating material layer 103, a semiconductor material layer 105, and a second insulating material layer 107, where the semiconductor material layer 105 is sandwiched between the first insulating material layer 103 and the second insulating material layer 107. The first insulating material layer 103 may be an oxide, such as silicon oxide. The second insulating material layer 107 may be nitride, oxide, oxynitride, or a combination thereof, for example, the second insulating material layer 107 may be constructed of silicon nitride, silicon oxide and silicon nitride. The semiconductor material layer 105 may be a silicon layer or a polysilicon layer.

Figure 5:
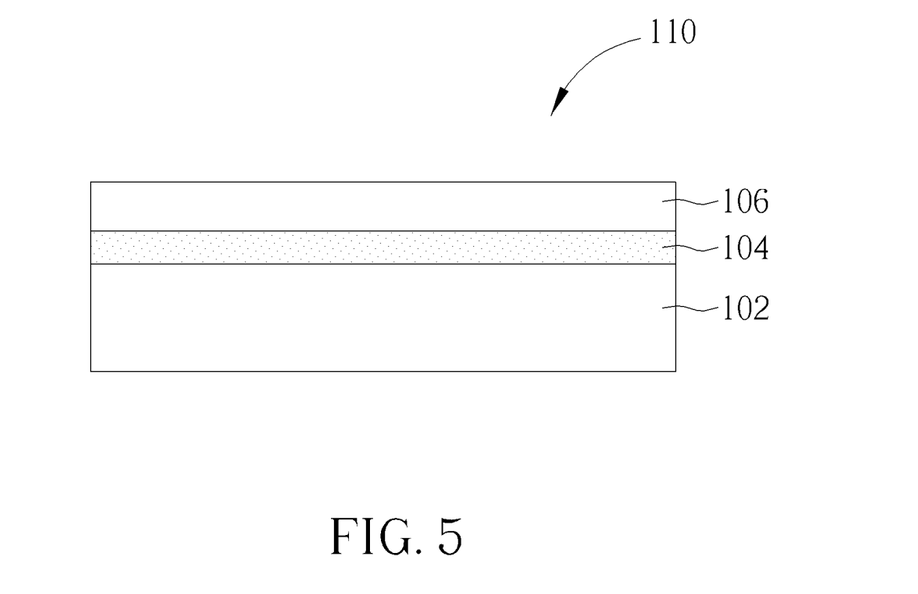
FIG. 5 is a schematic cross-sectional view of a substrate of a HEMT according to another embodiment of the present disclosure.

FIG. 5 is a schematic cross-sectional view of a substrate of a HEMT according to another embodiment of the present disclosure. As shown in FIG. 5, according to an embodiment of the present disclosure, the substrate 110 of the HEMT 100 may be a silicon-on-insulator (SOI) substrate, which includes a substrate 102, an insulating layer 104, and a semiconductor layer 106. The substrate 102 may be a handle wafer. The insulating layer 104 may be an oxide layer, such as silicon oxide, which may be formed on the substrate 102 by a thermal oxidation or a deposition process. The semiconductor layer 106 may be transferred from a device wafer to the substrate 102. For example, the side of the device wafer close to the semiconductor layer 106 may be bonded to the insulating layer 104 through a bonding process, and then the device wafer is thinned to form the semiconductor layer 106. In an embodiment, the semiconductor layer 111 of the HEMT 100 may be provided by the semiconductor layer 106 of the SOI substrate.

Figure 6:
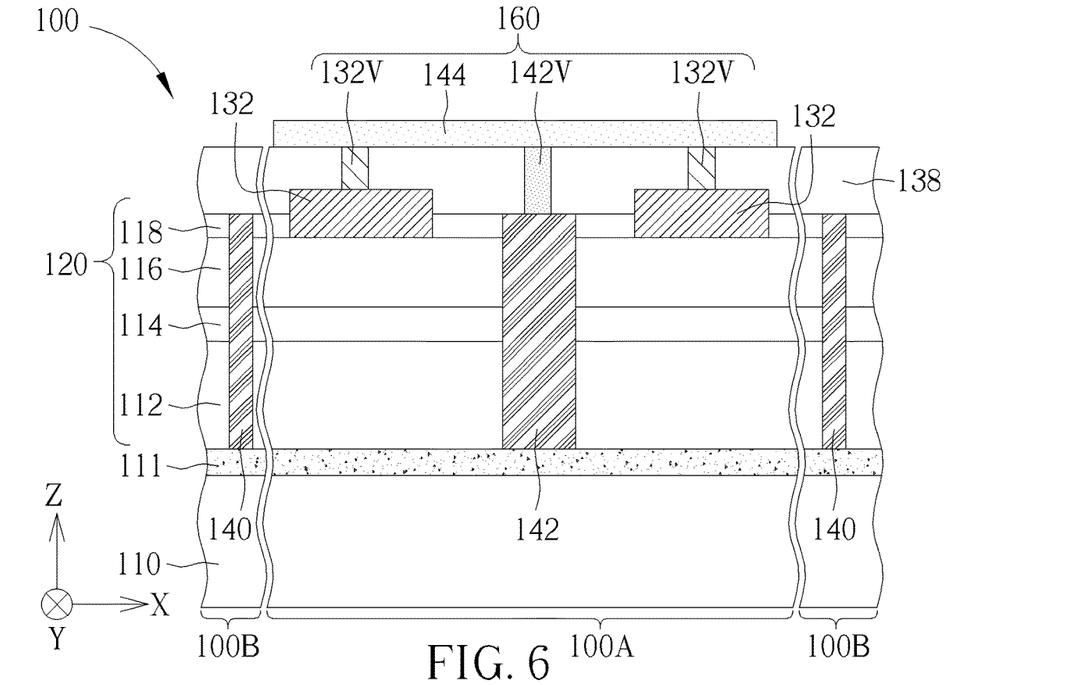
FIG. 6 is a schematic cross-sectional view of a HEMT according to one embodiment of the present disclosure, which is taken along the line B-B' of FIG. 1.

FIG. 6 is a schematic cross-sectional view of a HEMT according to one embodiment of the present disclosure, which is taken along the line B-B' of FIG. 1. As shown in FIG. 6, according to an embodiment of the present disclosure, the HEMT 100 includes the buried electrode 142 disposed between the adjacent source portions of the source electrode 132, and the buried electrode 142 passes through the compound semiconductor stacked layer 120 and directly contacts the semiconductor layer 111. For example, the buried electrode 142 may contact the top surface of the semiconductor layer 111, or reach a position within the semiconductor layer 111, or pass through the semiconductor layer 111. According to an embodiment of the present disclosure, the buried electrode 142 may be formed by etching the compound semiconductor stacked layer 120 to form a through via hole to expose the semiconductor layer 111 and filling the through via hole with a conductive material. Therefore, the buried electrode 142 is electrically connected to the semiconductor layer 111. In addition, according to an embodiment of the present disclosure, a constant electric potential, such as 0V or 1V, may be provided to the buried electrode 142 according to the actual requirements, so that the semiconductor layer 111 electrically connected to the buried electrode 142 also has a constant electric potential. In a preferred embodiment, the buried electrode 142 and the semiconductor layer 111 are grounded. Through disposing the buried electrode 142 in the active area 100A, the whole semiconductor layer 111 in the active area 100A of the HEMT 100 may have a constant electric potential or is stably grounded.

According to an embodiment of the present disclosure, the conductive material of the buried electrode 142 may be the same as that of the conductive structure 140, and the buried electrode 142 and the conductive structure 140 may be formed together by the same etching and deposition processes. For example, a hard mask (not shown) may be formed on the compound semiconductor stacked layer 120, and the opening of the hard mask exposes the regions where the conductive structure 140 and the buried electrode 142 are intended to be formed. Through the same etching process, the compound semiconductor stacked layer 120 is etched to form the trench of the conductive structure 140 and the through via hole of the buried electrode 142, and then through the same deposition process, a conductive material is deposited in the above mentioned trench and through via hole to form the conductive structure 140 and the buried electrode 142 at the same time.

In addition, according to an embodiment of the present disclosure, as shown in FIG. 6, the buried electrode 142 is electrically connected to the source electrode 132 through an interconnection structure 160 to have a constant electric potential or be grounded. The interconnection structure 160 includes vias 132V and 142V formed in a dielectric layer 138, and a metal wire layer 144 formed on the dielectric layer 138. The via 132V is connected to the source electrode 132, the via 142V is connected to the buried electrode 142, and the metal wire layer 144 is connected to the vias 132V and 142V. In addition, although it is not shown in FIG. 6, the conductive structure 140 surrounding the active area 100A may also be electrically connected to the source electrode 132 through the interconnection structure 160 to have a constant electric potential or be electrically grounded. For example, the conductive structure 140 may be electrically connected to any one of the source electrodes 132 or the contact pad 132P of the source electrodes in the active area 100A through other vias in the dielectric layer 138 and the metal wire layer 144 on the dielectric layer 138.

Figure 7:
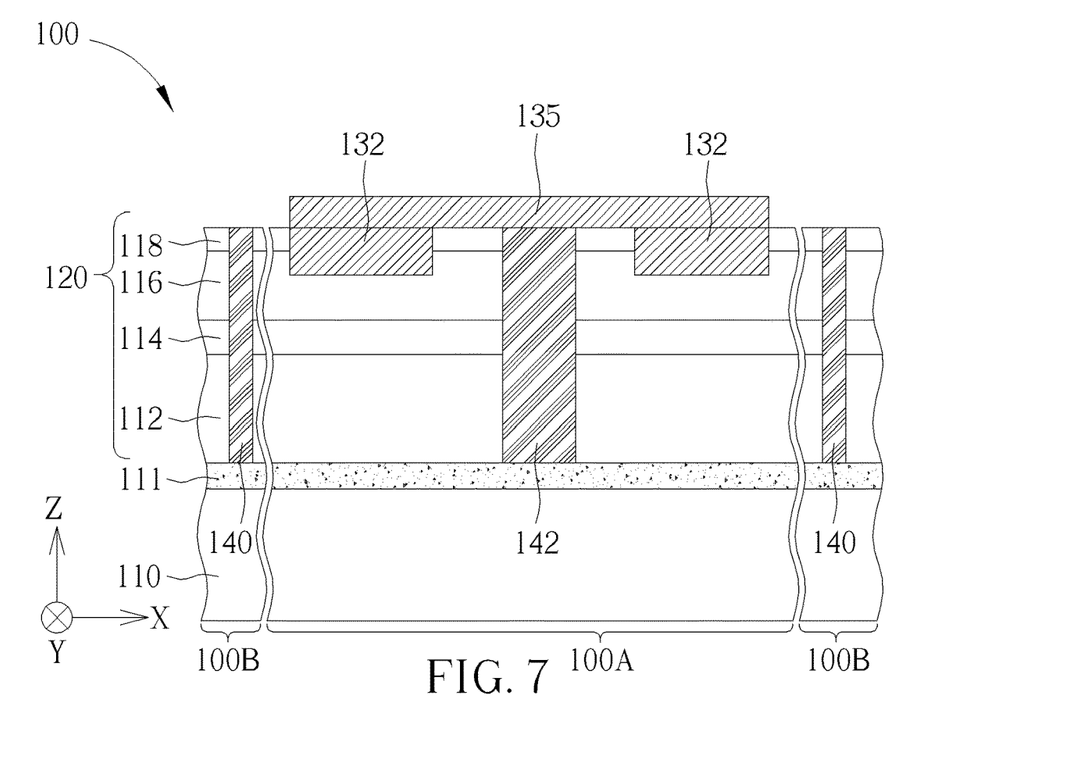
FIG. 7 is a schematic cross-sectional view of a HEMT according to another embodiment of the present disclosure, which is taken along the line B-B' of FIG. 1.

FIG. 7 is a schematic cross-sectional view of a HEMT according to another embodiment of the present disclosure, which is taken along the line B-B' of FIG. 1. The difference between FIG. 7 and FIG. 6 is that a source metal pattern 135 is further disposed on the multiple source portions of the source electrode 132 of the HEMT 100 in FIG. 7, and the buried electrode 142 is disposed directly under the source metal pattern 135. In addition, the buried electrode 142 directly contacts the source metal pattern 135 to be electrically connected to the source electrode 132. In this embodiment, the buried electrode 142 is electrically connected to the source electrode 132 through the source metal pattern 135 to have a constant electric potential or be electrically grounded. According to an embodiment of the present disclosure, a via may be further disposed between the source metal pattern 135 and the source electrode 132, so that the source metal pattern 135 may be electrically connected to those source portions of the source electrode 132 through the via.

According to the embodiments of the present disclosure, the conductive structure 140 surrounding the active area 100A is electrically connected to the semiconductor layer 111 on the substrate 110 and has a constant electric potential or is grounded, thereby preventing the semiconductor layer 111 of the HEMT 100 from generating a back-gating effect. Therefore, the dynamic on-state resistance (dynamic Ron) of the HEMT 100 is not greatly increased in high-voltage and high-current applications compared to low-voltage and low-current applications. The stability of the operation of the HEMT 100 is improved.

In addition, the buried electrode 142 in the active area 100A also directly contacts and is electrically connected to the semiconductor layer 111 on the substrate 110 and is configured to have a constant electric potential or be grounded, thereby further improving the grounding effect or the effect of stabilizing the electric potential of the semiconductor layer 111 in the active area 100A of the HEMT 100. Especially for the size of the device being larger, and the size of the active area 100A also becomes larger, the buried electrode 142 disposed in the active area 100A may make the whole semiconductor layer 111 have a constant electric potential or be stably grounded. When the HEMTs of the present disclosure are used in high-current and high-voltage applications, the dynamic on-resistance (dynamic Ron) of the HEMTs is greatly reduced compared to that of HEMTs without a conductive structure surrounding the active area. For example, when the voltage is 400 volts(V) and the current is 1 ampere(A), the dynamic on-resistance (dynamic Ron) of the embodiments of the present disclosure is reduced by at least about 13% compared to that of the HEMTs without a conductive structure surrounding the active area. When the voltage is 400 volts (V) and the current is 4 amperes(A), the dynamic on-resistance of the embodiments of the present disclosure is greatly reduced by at least about 57% compared to that of the HEMTs without a conductive structure surrounding the active area. Therefore, the electrical performance of the HEMTs of the present disclosure is improved.

According to the embodiments of the present disclosure, the conductive structure surrounding the active area is electrically connected to the semiconductor layer on the substrate and has a constant electric potential or is grounded, which reduces the dynamic on-resistance (dynamic Ron) of the HEMTs in high-voltage and high-current applications. In addition, the buried electrode in the active area directly contacts the semiconductor layer on the substrate and is configured to have a constant electric potential or be grounded, which further improves the grounding effect or the effect of stabilizing the electric potential of the semiconductor layer in the active area of the HEMTs. Especially for the size of the devices being larger, the dynamic on-resistance of the HEMTs of the present disclosure in high-current and high-voltage applications is greatly reduced compared to HEMTs without a conductive structure surrounding the active area, thereby improving the electrical performance of the HEMTs of the present disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a substrate, including an active area;
   a compound semiconductor stacked layer, comprising a buffer layer, a high resistance layer, a channel layer, and a barrier layer disposed on the substrate in sequence;
   a cap layer, disposed on the compound semiconductor stacked layer;
   a gate electrode, disposed on the cap layer and extending along a first direction;
   a source electrode and a drain electrode, disposed on the compound semiconductor stacked layer, respectively disposed on two sides of the gate structure, and arranged along a second direction, wherein the first direction is perpendicular to the second direction; and
   a buried electrode, passing through the compound semiconductor stacked layer, disposed in the active area and configured to have a constant electric potential or be grounded,
   wherein the source electrode comprises a first portion and a second portion arranged along the first direction, the buried electrode is disposed between the first portion and the second portion, and the buried electrode is separated from the first portion and the second portion.

2. The high electron mobility transistor of claim 1, further comprising a semiconductor layer, disposed between the substrate and the compound semiconductor stacked layer, wherein the material of the semiconductor layer comprises silicon, gallium nitride, ceramic, silicon carbide, aluminum nitride, aluminum oxide, or a combination thereof.

3. The high electron mobility transistor of claim 2, further comprising a conductive structure, passing through the compound semiconductor stacked layer and surrounding the active area, wherein the conductive structure is configured to have a constant electric potential or be grounded.

4. The high electron mobility transistor of claim 3, wherein the buried electrode is electrically connected to the semiconductor layer, or the conductive structure is electrically connected to the semiconductor layer.

5. The high electron mobility transistor of claim 1, wherein the buried electrode is electrically connected to the source electrode through an interconnection structure.

6. The high electron mobility transistor of claim 1, further comprising a source metal pattern, disposed on the first portion and the second portion of the source electrode, wherein the buried electrode is disposed directly under the source metal pattern, and the buried electrode is electrically connected to the source electrode through the source metal pattern.

7. The high electron mobility transistor of claim 1, wherein the source electrode and the drain electrode pass through the barrier layer to a top surface of the channel layer, or into the channel layer.

8. The high electron mobility transistor of claim 1, wherein the substrate comprises a core substrate and a composite material layer wrapping around the core substrate.

9. The high electron mobility transistor of claim 8, wherein the core substrate comprises ceramic, silicon carbide, aluminum nitride or sapphire, and the composite material layer comprises an insulating material layer and a semiconductor material layer.

10. A high electron mobility transistor (HEMT), comprising:
    a substrate, including an active area, wherein the active area comprises a plurality of repeating units;
    a compound semiconductor stacked layer, comprising a buffer layer, a high resistance layer, a channel layer, and a barrier layer disposed on the substrate in sequence; and
    a conductive structure, passing through the compound semiconductor stacked layer, surrounding the active area and configured to have a constant electric potential or be grounded, wherein at least one of the repeating units comprises:
       a cap layer, disposed on the compound semiconductor stacked layer;
       a gate electrode, disposed on the cap layer and extending along a first direction; and
       a source electrode and a drain electrode, disposed on the compound semiconductor stacked layer, respectively disposed on two sides of the gate electrode, and arranged along a second direction, wherein the first direction is perpendicular to the second direction.

11. The high electron mobility transistor of claim 10, further comprising a buried electrode, passing through the compound semiconductor stacked layer, disposed in the active area and configured to have a constant electric potential or be grounded.

12. The high electron mobility transistor of claim 11, wherein the conductive structure is separated from the source electrode, and the conductive structure is electrically connected to the source electrode through an interconnection structure.

13. The high electron mobility transistor of claim 10, further comprising a semiconductor layer, disposed between the substrate and the compound semiconductor stacked layer, wherein the material of the semiconductor layer comprises silicon, gallium nitride, ceramic, silicon carbide, aluminum nitride, aluminum oxide, or a combination thereof.

14. The high electron mobility transistor of claim 11, wherein the source electrode comprises a first portion and a second portion arranged along the first direction, the buried electrode is disposed between the first portion and the second portion, and the buried electrode is separated from the first portion and the second portion.

15. The high electron mobility transistor of claim 14, wherein the buried electrode is electrically connected to the source electrode through an interconnection structure.

16. The high electron mobility transistor of claim 14, further comprising a source metal pattern, disposed on the first portion and the second portion of the source electrode, wherein the buried electrode is disposed directly under the source metal pattern, and the buried electrode directly contacts the source metal pattern to be electrically connected to the source electrode.

17. The high electron mobility transistor of claim 10, wherein the at least one of the repeating units further comprises another gate electrode, the drain electrode is disposed between the gate electrode and the another gate electrode, or the source electrode is disposed between the gate electrode and the another gate electrode.

18. The high electron mobility transistor of claim 10, wherein the source electrode and the drain electrode pass through the barrier layer to a top surface of the channel layer, or into the channel layer.

19. The high electron mobility transistor of claim 10, wherein the substrate comprises a silicon-on-insulator substrate.

* * * * *